(12) United States Patent
Matsunaga et al.

(10) Patent No.: US 6,583,018 B1
(45) Date of Patent: Jun. 24, 2003

(54) METHOD OF ION IMPLANTATION

(75) Inventors: Yasuhiko Matsunaga, Narita (JP); Majeed Ali Foad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/719,089

(22) PCT Filed: Jun. 8, 1999

(86) PCT No.: PCT/JP99/03040

§ 371 (c)(1),
(2), (4) Date: Feb. 5, 2001

(87) PCT Pub. No.: WO99/65069

PCT Pub. Date: Dec. 16, 1999

(30) Foreign Application Priority Data

Jun. 8, 1998 (JP) .......................................... 10-159109

(51) Int. Cl.⁷ ............................................. H01L 21/331
(52) U.S. Cl. ...................... 438/373; 438/289; 438/298; 438/305; 438/449; 438/450; 259/344; 259/345; 259/408
(58) Field of Search ................................. 438/373, 217, 438/289, 298, 305, 449, 450, 528; 257/344, 345, 408

(56) References Cited

U.S. PATENT DOCUMENTS 5,266,510 A * 11/1993 Lee ............................ 438/289
6,037,640 A *  3/2000 Lee ............................ 257/408
6,313,505 B2 * 11/2001 Yu ............................. 257/336

FOREIGN PATENT DOCUMENTS

| JP | 63-2322 | 1/1988 |
|----|---------|--------|
| JP | 1-212451 | 8/1989 |
| JP | 2-307277 | 12/1990 |
| JP | 3-96228 | 4/1991 |
| JP | 3-248419 | 11/1991 |
| JP | 5-36618 | 2/1993 |
| JP | 07263358 | 3/1994 |
| JP | 6-232390 | 8/1994 |
| JP | 8-115907 | 5/1996 |
| JP | 8-293465 | 11/1996 |

OTHER PUBLICATIONS

Downey, et al. "Dose–rate effects on the formation of ultra–shallow junctions with low–energy $B^+$ and $BF^{+_2}$ ion implants," Oct. 31, 1997, pp. 562–569.

Bousetta, et al. "Si Ultrashallow $p^+n$ junctions using low–energy boron implantation," Apr. 15, 1995, pp. 1626–1628.

* cited by examiner

Primary Examiner—David Nelms
Assistant Examiner—Renee R Berry
(74) Attorney, Agent, or Firm—Moser, Patterson & Sheridan LLP

(57) ABSTRACT

An ion implantation method which can accurately control the effective dose amount even in ion implantation at a very low energy. This ion implantation method comprises the steps of carrying out preamorphization ion implantation for a semiconductor substrate in an ion implantation apparatus; then cleaning the surface of semiconductor substrate in a cleaning apparatus so as to eliminate an oxidized film; and thereafter carrying out ion implantation again in the ion implantation apparatus under a low implantation energy so as to form a shallow junction in the semiconductor substrate. As a consequence, the influence of the oxidized film formed by preamorphization ion implantation can be suppressed, whereby the effective dose can be controlled accurately.

5 Claims, 2 Drawing Sheets

METHOD OF ION IMPLANTATION

TECHNICAL FIELD

The present invention relates to an ion implantation technique for use in a semiconductor device manufacturing process or the like and, more particularly, is concerned with a low-energy ion implantation technique for forming a shallow junction in a semiconductor substrate.

BACKGROUND ART

As semiconductor devices have been becoming more highly integrated and finer in recent years, there is a demand for forming shallow source/drain regions and thin gate insulating films, i.e., forming shallow junctions. For responding to such a demand, a low-energy ion implantation technique which implants ions at a low implantation energy has conventionally been employed, whereby ion implantation under a very low energy of 0.2 keV has recently become possible.

If the implantation energy is lowered, on the other hand, then ions are implanted deeper due to a channeling phenomenon. Recently, for preventing such a phenomenon, a preamorphization technique has also come into practice, which comprises the steps of implanting ions which form no electric carriers, such as germanium, argon, silicon or xenon, beforehand so as to cause a surface of a semiconductor substrate to have an amorphous state; and then continuously implanting aimed ions.

In the ion implantation with a very low energy, however, the projected range of ions is so shallow that the ions may be trapped in a naturally oxidized film formed on the substrate surface without reaching the inside of the semiconductor substrate. The atoms trapped by the naturally oxidized film are eliminated together with the naturally oxidized film in a cleaning process subsequent to the ion implantation process. Due to this mechanism, the implanted ion dose (effective dose) remaining in the semiconductor substrate after cleaning becomes smaller than the dose actually implanted in the ion implantation process or the measured dose (calculated dose). Also, the effective dose fluctuates since the thickness of naturally oxidized film fluctuates under the influence of the process immediately prior to the ion implantation.

Therefore, the surface of semiconductor substrate has conventionally been cleaned immediately before the semiconductor substrate is loaded into an ion implantation apparatus.

In practice, however, the effective dose may fluctuate for some unknown reason even in the above-mentioned process, i.e., the process in which the preamorphization ion implantation and the very-low-energy ion implantation of the aimed ions are continuously carried out after cleaning the semiconductor substrate (eliminating the oxidized film).

DISCLOSURE OF THE INVENTION

Hence, it is an object of the present invention to provide an ion implantation method which can accurately control the effective dose even upon ion implantation at a very low energy.

For achieving the above-mentioned object, the inventors have diligently studied the above-mentioned conventional ion implantation process and, as a result, has found that, in the preamorphization ion implantation process, oxygen existing within the ion implantation apparatus is implanted into the semiconductor substrate by ion beams, so as to form an oxidized film. The oxygen existing within the ion implantation apparatus includes that adsorbed onto the surface of semiconductor substrate during the transportation after cleaning, and that desorbed or floated from the inner wall face of the ion implantation apparatus upon heating by ion beam sputtering, beam power, and the like after having been adsorbed thereon. The inventors have found that the oxygen film thus formed in the preamorphization ion implantation process also influences the effective dose, since it traps ions in the subsequent process and is eliminated by the cleaning process after the ion implantation as with the naturally oxidized film.

The present invention is achieved according to such findings, and comprises the steps of carrying out preamorphization ion implantation for causing a surface of a semiconductor substrate to attain an amorphous state; then cleaning the surface of semiconductor substrate subjected to preamorphization ion implantation so as to eliminate an oxidized film; and thereafter carrying out ion implantation under a low implantation energy so as to form a shallow junction in the semiconductor substrate. As a consequence, the influence of the oxidized film formed by preamorphization ion implantation can be suppressed.

The semiconductor substrate is effectively cleaned with hydrofluoric acid.

In general, the semiconductor substrate is exposed to atmosphere after cleaning the semiconductor substrate until the low-energy ion implantation is started if common equipment is used. Therefore, it will be effective if the period of time after the cleaning until the starting of low-energy ion implantation is made constant. This is because of the fact that, in such a case, the amount of oxygen attaching to the semiconductor substrate becomes constant, so that the thickness of the oxidized film formed upon low-energy ion implantation, and the amount of ion trapped therein, in turn, become substantially constant, whereby the effective dose can be controlled more reliably.

Preferably, the ion species employed in preamorphization ion implantation is germanium, silicon, argon or xenon. Preferably, the ion species employed in the low-energy ion implantation is boron, and the implantation energy is about 2 keV or lower.

These and other features and advantages of the present invention will become apparent to those skilled in the art upon a reading of the following detailed description when taken in conjunction with the attached drawings.

BEST MODE FOR CARRYING OUT THE INVENTION

Now, a preferred embodiment of the present invention will be explained in detail with reference to the drawings.

Figure 1:
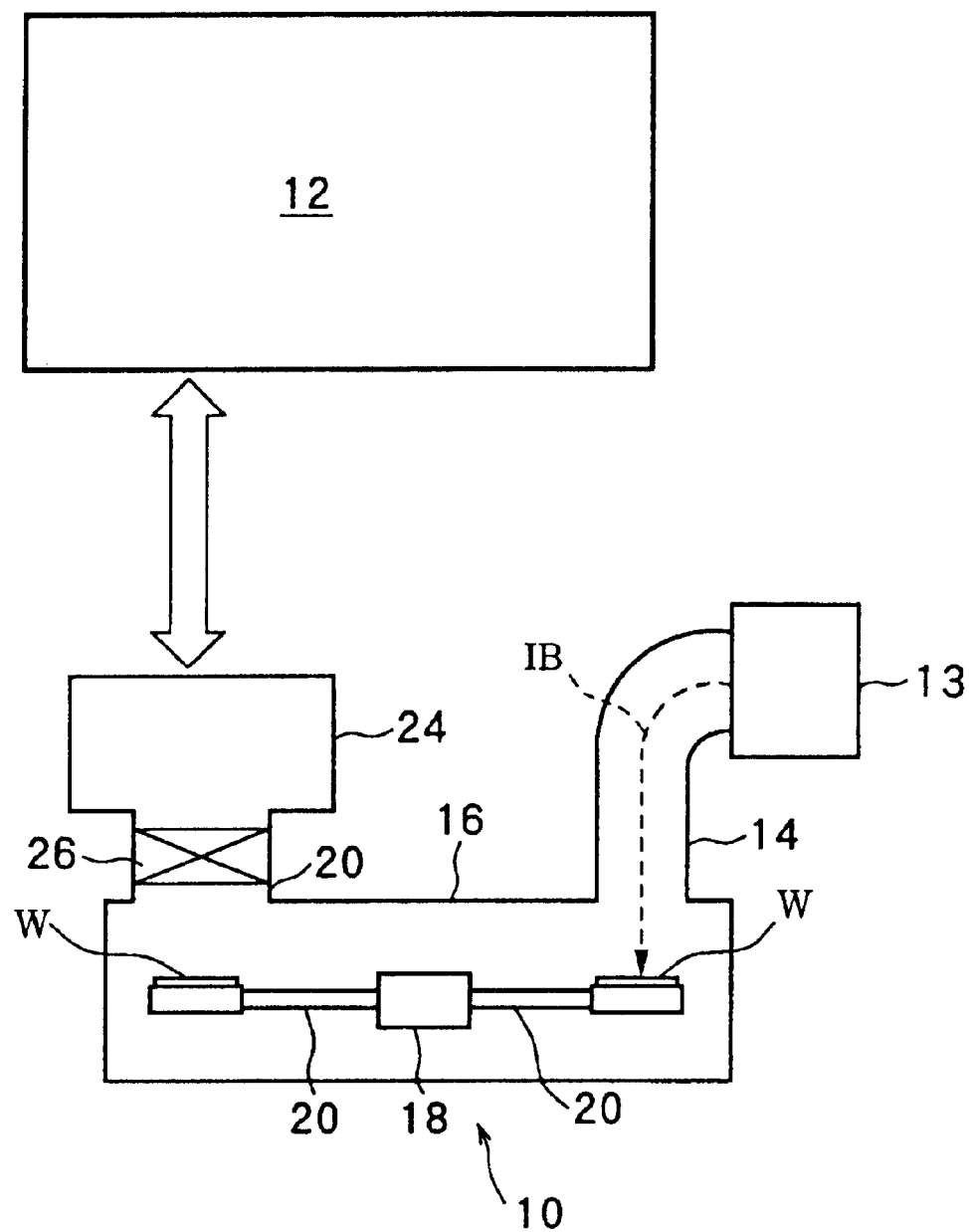
FIG. 1 is an explanatory view schematically showing equipment suitable for carrying out the ion implantation method of the present invention.

FIG. 1 shows equipment which can carry out the ion implantation method of the present invention, in which numerals 10 and 12 generally designate an ion implantation apparatus and a cleaning apparatus, respectively. The ion implantation apparatus 10 in this embodiment is capable of ion implantation at a very low implantation energy of 5 keV or lower, preferably 1 keV or lower. For example, the ion implantation apparatus manufactured and sold under the trademark of "Implant xR LEAP" by Applied Materials Incorporated is preferable therefor. Here, "Implant xR LEAP" employs a deceleration mode in which the ion beam IB accelerated at a stage upstream from a beam line section 14 is decelerated at a downstream stage, so as to lower the implantation energy, and has been verified that it can implant boron at a very low energy of 0.2 keV.

The ion implantation section 16 in the shown ion implantation apparatus 10 comprises a substrate holding wheel 18 disposed therein. The substrate holding wheel 18 has such a structure that a semiconductor substrate W is held at distal ends of a plurality of radially extending arms 20, and is driven such that the ion beam IB from the beam line section 14 can scan over a surface of the semiconductor substrate W.

A loader section 24 is disposed at a position near the ion implantation section 16 by way of a transportation tube 22. An isolation valve 26 is disposed within the transportation tube 22, whereby the ion implantation section 16 and the loader section 24 can be pneumatically separated from each other. As a consequence, while a vacuum is maintained in the ion implantation section 16 and beam line section 14, only the loader section 24 can open into atmosphere, whereby the semiconductor substrate W can be carried into the loader section 24 from the outside of the ion implantation apparatus 10. The semiconductor substrate W can be transferred between the loader section 24 and the ion implantation section 16 by a robot (not shown).

The cleaning apparatus 12 is installed near the ion implantation apparatus 10 within a clean room in which the ion implantation apparatus 10 is installed. Though not clearly shown in the drawing, the cleaning apparatus 12 is of a known type constituted by a loader section for transferring the semiconductor substrate W from/to the outside of the apparatus, a cleaning section for eliminating oxidized films from the surface of semiconductor substrate W by cleaning, a rinse section for eliminating cleaning chemicals, and a drying section.

In general, the cleaning chemical used for eliminating oxidized films is hydrofluoric acid, whereas the rinse liquid is ultrapure water. Preferably, for preventing naturally oxidized films from being formed again, the drying section carries out drying by nitrogen gas blows, for example. Preferably, the cleaning apparatus 12 is configured such that the semiconductor substrate W carried into the loader section does not come into contact with atmosphere at all until it returns to the loader section again after a series of processes of cleaning, rinsing and drying.

An embodiment of the ion implantation method in accordance with the present invention using equipment such as the one mentioned above will now be explained.

In this embodiment, it is assumed that, after a preamorphization ion implantation process with germanium is carried out by use of the above-mentioned ion implantation apparatus 10, a very-low-energy ion implantation process is carried out so as to form a very shallow junction in the semiconductor substrate or silicon wafer W.

First, as preprocessing, the semiconductor substrate W to be processed is cleaned in the cleaning section of the cleaning apparatus 12, so as to eliminate the naturally oxidized film formed on the substrate surface. The cleaned semiconductor substrate W is rinsed with ultrapure water in the rinse section, and then is fully dried in the drying section before being returned to the loader section. Then, while the semiconductor substrate W is being transferred from the loader section of cleaning apparatus 12 to the loader section 24 of ion implantation apparatus 10, atmosphere comes into contact with the semiconductor substrate W, whereby oxygen, though by a very small amount, is adsorbed onto the substrate surface.

Once the semiconductor substrate W is carried into the loader section 24 of the ion implantation apparatus 10, the pressure within the loader section 24 is reduced, and the isolation valve 26 of transportation tube 22 is opened. Thereafter, the semiconductor substrate W is transported from the transportation tube 22 to the ion implantation section 16 by the robot, so as to be held at the respective ends of the individual arms 20 of the substrate holding wheel 18.

Subsequently, germanium ion is implanted to amorphize the surface of semiconductor substrate W. As explained above, the preamorphization implantation process aims at preventing the channeling phenomenon from occurring in the subsequent boron ion implantation process. In this preamorphization implantation process, oxygen on the semiconductor substrate surface is implanted into the semiconductor substrate W upon irradiation with the germanium ion beam IB, whereby forming an oxidized film though very slightly.

The foregoing cleaning process and preamorphization implantation process are carried out as in conventional techniques.

The present invention is characterized in that the cleaning process is carried out again after the preamorphization implantation process is completed. Namely, after the semiconductor substrate W is returned to the loader section 24, the isolation valve 26 of transportation tube 22 is closed, so that only the loader section 24 opens into atmosphere, and the semiconductor substrate W is transferred to the cleaning apparatus 12. Then, as in the above-mentioned cleaning process, the oxidized film of semiconductor substrate W is eliminated by cleaning, and rinsing and drying are carried out.

If the drying of semiconductor substrate W is completed, then the semiconductor substrate W is returned to the ion implantation apparatus 10. Here, it is preferred that the time during which the semiconductor substrate W is exposed to atmosphere be as short as possible, and that the exposure time (transportation time) be made constant. The former, "to shorten the exposure time", aims at greatly lowering the amount of oxygen adsorbed onto the surface of semiconductor substrate W or making it substantially zero, whereas the latter aims at causing the oxidized film formed in the subsequent boron implantation process to have a constant thickness. If the drying section of the cleaning apparatus 12 resides in an environment where oxygen exists, then it is desirable that the period of time after the starting of drying process until the completion of pressure reduction in the loader section 24 of ion implantation apparatus 10 into which the semiconductor substrate W is carried be 2 hours or less and constant.

The semiconductor substrate W returned to the ion implantation apparatus 10 is held by the substrate holding wheel 18 of ion implantation section 16 by way of the same procedure as that mentioned above, whereby a very-low-energy boron implantation process is started. Since this boron implantation process is carried out in a state where no oxidized film is substantially formed on the substrate surface, the situation where implanted boron is trapped by an oxidized film is substantially eliminated. Though oxygen adsorbed onto the surface of semiconductor substrate W forms an oxidized film due to ion implantation during the boron implantation process as well, since this process is carried out at a very low energy (e.g., 2 keV or lower), thus formed oxidized film has such an extent that it is negligible as compared with that in the case of the preamorphization process carried out at a higher energy (e.g., about 5 keV).

In general, after the completion of boron implantation process, a cleaning process is carried out in the cleaning apparatus 12, and an annealing process on the order of seconds is subsequently performed at a high temperature so as to prevent accelerated diffusion from occurring due to point defects. In the cleaning process, the oxidized film formed during the boron implantation process and during transportation is eliminated. Since the boron trapped in this oxidized film is also eliminated thereby, the effective dose slightly differs from the amount (calculated dose) actually implanted in the ion implantation apparatus. However, if the period of time during which the semiconductor substrate W is exposed to atmosphere is made constant, then the oxidized film is formed with a constant thickness as mentioned above, so that the effective dose and the calculated dose have a constant relationship therebetween even after the oxidized film is eliminated, whereby the effective dose can be controlled more intricately.

While an embodiment of the present invention is explained in detail in the foregoing, the present invention is not limited to the above-mentioned embodiment. For example, the ion implantation apparatus and cleaning apparatus are not restricted to those described and shown. Also, the ion species implanted in the preamorphization implantation process is not limited to germanium and may be any of ion species which form no electric carriers, such as silicon, argon, and xenon, whereas the ion forming a shallow junction is not limited to boron.

EXAMPLES

Results of experiments carried out for studying the effects of the present invention will now be explained with reference to FIG. 2.

In these experiments, the ion implantation apparatus manufactured and sold under the trademark of "Implant xR LEAP" by Applied Materials Incorporated was used for carrying out ion implantation.

In the experiments (Examples 1 and 2) concerning the present invention, operations were carried out in conformity to the procedure explained in the above-mentioned embodiment, whereas, in the boron implantation process, the implantation energy was set so as to drift from 2 keV to 0.2 keV, and the calculated dose was set to $1.0 \times 10^{15}$ ions/$cm^2$. The implantation energy and calculated dose were set to 5 keV and $2.0 \times 10^{14}$ ions/$cm^2$, respectively, in the preamorphization implantation process with germanium ion in Example 1. The implantation energy and calculated dose were set to 5 keV and $1.0 \times 10^{15}$ ions/$cm^2$, respectively, in the preamorphization implantation process in Example 2. Further, in Examples 1 and 2, the period of time after the completion of the cleaning process subsequent to the preamorphization implantation process until the starting of boron implantation was constantly held at 2 hours.

On the other hand, comparative experiments (Comparative Examples 1 and 2) were carried out while omitting the cleaning process after the preamorphization implantation process, so as to continuously perform boron implantation subsequent to the preamorphization implantation process as in conventional techniques. Comparative Examples 1 and 2 were under the same conditions as those of Examples 1 and 2 except for the lack of cleaning process. Also carried out was a comparative experiment (Comparative Example 3) omitting the preamorphization implantation process with germanium ion, so as to perform the boron implantation process immediately after the cleaning process of the preprocessing.

In each of Examples and Comparative Examples, after the completion of boron implantation process, the semiconductor substrate was subjected to a cleaning process as postprocessing, and then to an annealing process at 950° C. for 10 seconds. The sheet resistance value Rs was measured for each of thus obtained semiconductor substrates, and thus measured values were plotted in a graph, which is FIG. 2.

Figure 2:
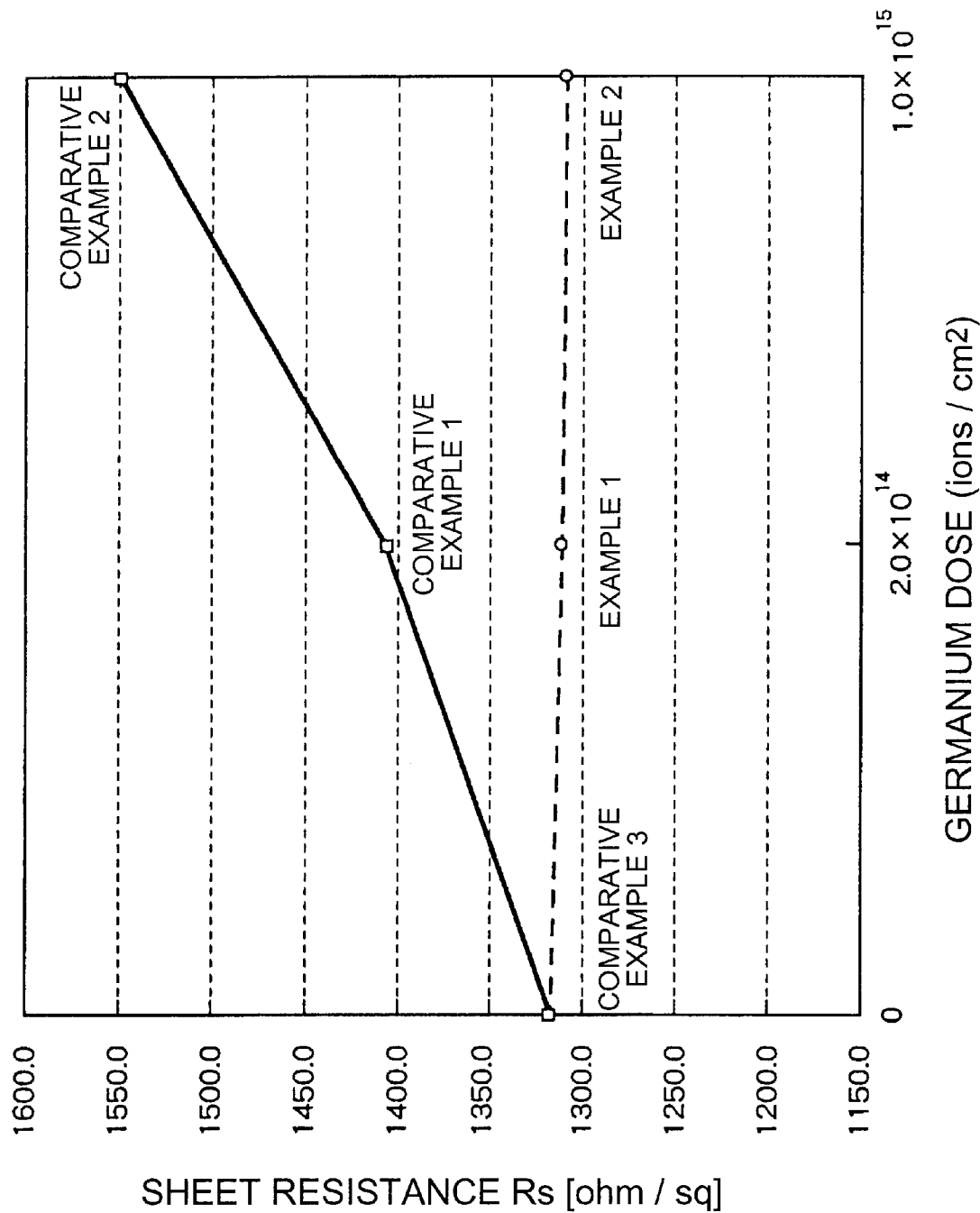
FIG. 2 is a graph showing sheet resistance values of semiconductor substrates obtained by Examples of the present invention and Comparative Examples.

It can be seen from FIG. 2 that Examples 1 and 2 and Comparative Example 3 exhibit substantially the same value of sheet resistance, whereas Comparative Examples 1 and 2 omitting the cleaning process after the preamorphization implantation process yield sheet resistance values higher than those of Examples 1 and 2.

The sheet resistance becomes higher as the dose of boron remaining in the semiconductor substrate surface is smaller. Therefore, it can be presumed that Comparative Examples 1 and 2 yield higher sheet resistance values since the actually implanted boron was partly eliminated from the semiconductor substrate, which occurred as the oxidized film was eliminated by cleaning.

Here, the reason why Comparative Example 2 exhibits a sheet resistance value higher than that of Comparative Example 1 is considered to be because of the fact that a greater amount of germanium was implanted in the case of Comparative Example 2, whereby a thicker oxidized film was formed therein. In practice, the semiconductor substrates obtained by Comparative Examples 1 and 2 were subjected to X-ray photoelectron spectroscopy (XPS) so as to measure the thickness of oxidized film on the surface, whereby the thickness was 17±3 angstroms in Comparative Example 1 and 21±3 angstroms in Comparative Example 2.

In Comparative Example 3, no oxidized film was formed by preamorphization implantation, whereby a very small amount of boron is eliminated by postprocessing. Hence, it has been demonstrated that, since the sheet resistance value in Comparative Example 3 and those in Examples 1 and 2 are substantially the same, the method of the present invention overcomes the problem of boron being trapped by the oxidized film formed upon preamorphization implantation, thereby constantly yielding a stable effective dose.

INDUSTRIAL APPLICABILITY

In the ion implantation method in accordance with the present invention, as explained in the foregoing, the effective dose of boron or the like can be controlled accurately when boron or the like is implanted into a semiconductor substrate so as to form a shallow junction. It allows ion implantation apparatus to fully exhibit their inherent controlling capacity, and enables high-precision profile control required for semiconductor devices manufactured by way of this ion implantation method, thus serving to improve and stabilize their characteristics, thereby contributing toward improvement in the semiconductor manufacturing technique.

What is claimed is:
1. An ion implantation method comprising:
   a first ion implanting of a surface of a semiconductor substrate to attain an amorphous state;
   cleaning said surface of the semiconductor substrate subjected to said first ion implanting;

exposing said surface of the semiconductor substrate to oxygen for a time sufficient to form an oxide layer on said surface; and a second ion implanting under a low implantation energy to form a shallow junction in said semiconductor substrate.

2. An ion implantation method according to claim 1, wherein the cleaning said surface comprises applying hydrofluoric acid.

3. An ion implantation method according to claim 1, wherein the ion implantation method is repeated for multiple substrates and the time sufficient to form the oxide layer is substantially the same for each substrate.

4. An ion implantation method according to claim 1, wherein an ion species employed in the first ion implanting is at least one member selected from the group consisting of germanium, silicon, argon and xenon.

5. An ion implantation method according to claim 1, wherein an ion species employed in the second ion implanting is boron, said implantation energy being about 2 keV or lower.

* * * * *